US012720719B2

(12) United States Patent
Chang et al.

(10) Patent No.: US 12,720,719 B2
(45) Date of Patent: Aug. 25, 2026

(54) VARYING THE PO SPACE IN SEMICONDUCTOR LAYOUTS

(71) Applicant: Taiwan Semiconductor Manufacturing Company, Ltd., Hsinchu (TW)

(72) Inventors: Feng-Ming Chang, Hsinchu (TW); Jui-wen Chang, Hsinchu (TW); Chao-Yuan Chang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 755 days.

(21) Appl. No.: 17/661,795

(22) Filed: May 3, 2022

(65) Prior Publication Data

US 2023/0363132 A1 Nov. 9, 2023

(51) Int. Cl.

*H10D 89/10* (2025.01)
*H10B 10/00* (2023.01)
*H10D 64/23* (2025.01)

(52) U.S. Cl.

CPC ............ *H10B 10/12* (2023.02); *H10D 89/10* (2025.01); *H10D 64/258* (2025.01)

(58) Field of Classification Search

CPC ................ H10B 10/12; H01L 27/0207; H01L 29/41775

See application file for complete search history.

(56) References Cited

U.S. PATENT DOCUMENTS 8,237,203 B2 8/2012 Tsuda et al.
9,424,385 B1 8/2016 Tien et al.
9,893,064 B2 * 2/2018 Chung ................. H10D 84/853
10,541,244 B1 1/2020 Chen et al.
2007/0002617 A1 * 1/2007 Houston ................ H10B 10/12 257/E27.099
2017/0170812 A1 * 6/2017 Abdo ......................... H01P 1/38
2019/0189197 A1 * 6/2019 Nii ........................ G11C 11/419
2019/0386012 A1 12/2019 Hsieh et al.
2020/0058656 A1 * 2/2020 Guo ....................... H10B 10/12

(Continued)

FOREIGN PATENT DOCUMENTS

CN 105807556 B 12/2019
TW I446198 B 7/2014

*Primary Examiner* — Meiya Li

(74) *Attorney, Agent, or Firm* — Ingrassia Fisher & Lorenz, LLP | IF&L

(57) ABSTRACT

A semiconductor device comprising a plurality of cells arranged in an array is disclosed. Each cell comprises: at least one active region arranged along a first direction; and at least five spaced apart conductive regions arranged along a second direction disposed over the active regions, wherein the first through fifth conductive regions comprise one or more conductors, wherein the one or more conductors have a dimension along the first direction. The dimension along the first direction is larger for at least one conductor in the first or fifth conductive regions than the dimension along the first direction for a conductor in the third conductive region. The pitch between conductors in the second and the fourth conductive region and the pitch between a conductor in the second or fourth conductive region and a conductor in a next closest conductive region that is not the second or fourth conductive region are different.

20 Claims, 8 Drawing Sheets

(56) References Cited

U.S. PATENT DOCUMENTS

2020/0243128 A1* 7/2020 Sato .................... G11C 11/4085
2021/0082475 A1 3/2021 Chen et al.
2021/0098467 A1* 4/2021 Fujiwara .................. G11C 7/18

* cited by examiner

VARYING THE PO SPACE IN SEMICONDUCTOR LAYOUTS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
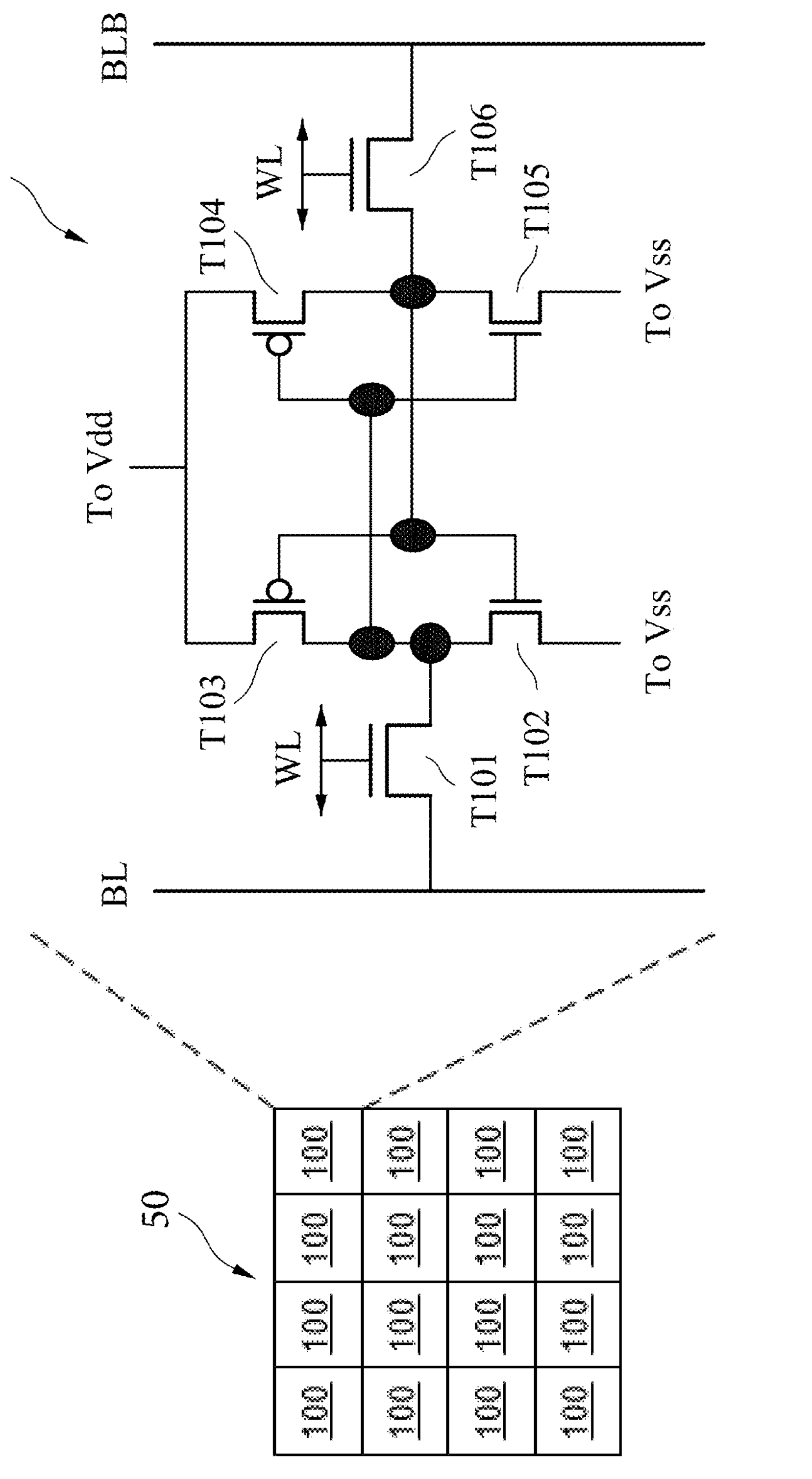
FIG. 1A shows a logic diagram of an example 6T SRAM cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

Features of the present disclosure can be applied to SRAM designs with CMOS (complementary metal-oxide-semiconductor) planar FET (field effect transistor) or multi-gate FET devices including double-gate FET, triple-gate FET, omega-gate FET, and gate-all-around (or surround-gate), and/or FinFET (field effect transistor with fin-like channels). Features of the present disclosure can be applied to other circuit designs such as other types of memory designs or other designs wherein a circuit element is repeated multiple times in a device.

Figure 1B:
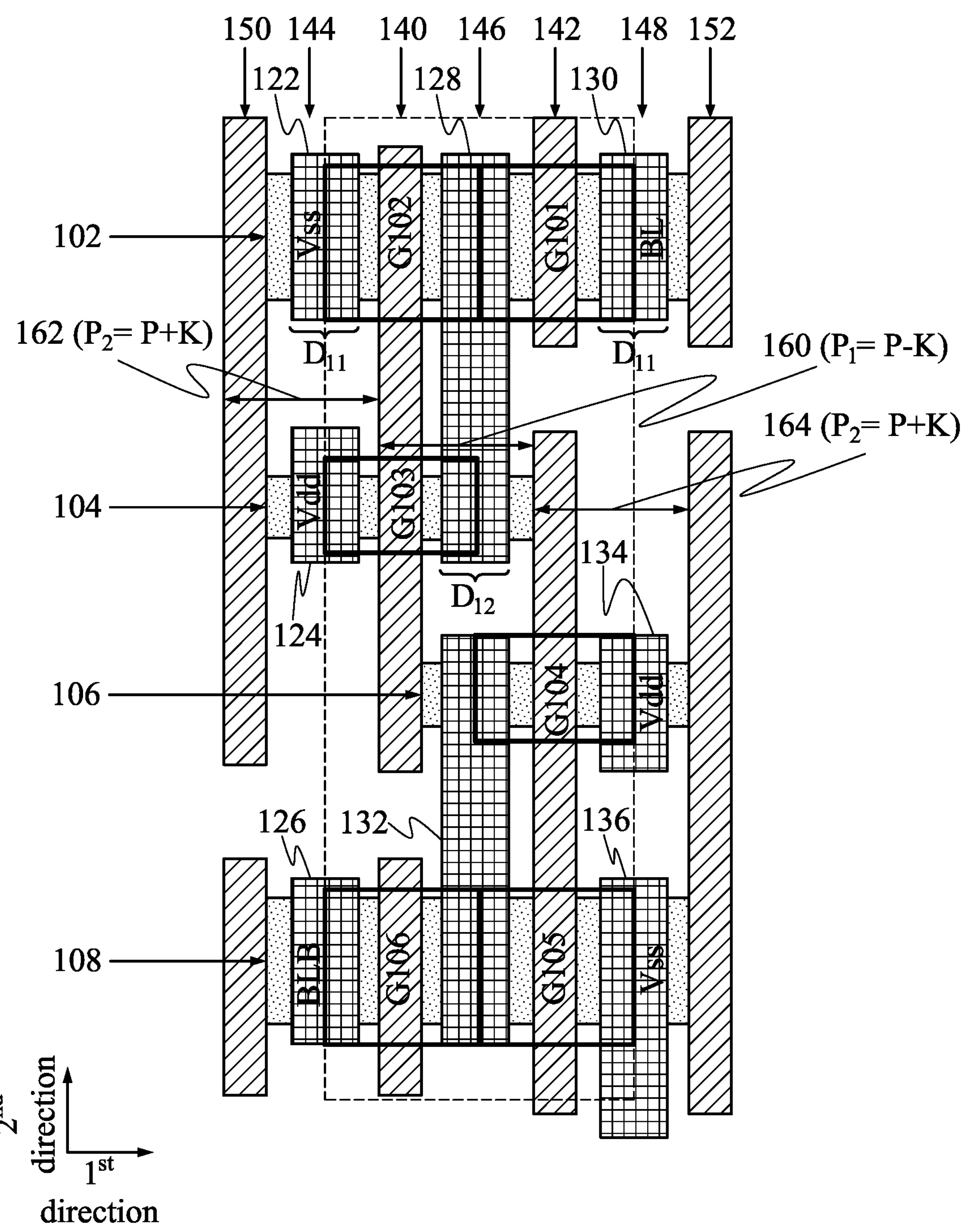
FIG. 1B shows a layout design (of certain layers) and a top view of the 6T SRAM cell of FIG. 1A, in accordance with some embodiments.

FIG. 1A shows a schematic logic diagram of an example 6T SRAM cell 100. FIG. 1B shows a layout (of certain layers) and a top view of the SRAM cell 100 in an embodiment. Referring to FIG. 1A, the 6T SRAM cell 100 includes two inverters cross-coupled for storage. The first inverter includes a pull-up transistor PU1 (or T103) and a pull-down transistor PD1 (or T102) connected in series between high and low potentials, VDD and VSS. The second inverter includes a pull-up transistor PU2 (or T104) and a pull-down transistor PD2 (or T105) connected in series between the high and low potentials, VDD and VSS. The 6T SRAM cell 100 further includes two pass gate transistors PG1 (or T101) and PG2 (or T106). The gate terminals of PG1 and PG2 are connected to word line WL. One of the two source/drain (S/D) terminals of PG1 is coupled to the gate terminals of PU2 and PD2, and the other one of the two S/D terminals of PG1 is coupled to bit line BL. One of the two source/drain (S/D) terminals of PG2 is coupled to the gate terminals of PU1 and PD1, and the other one of the two S/D terminals of PG2 is coupled to inverse bit line (BLB).

Referring to FIG. 1B, the transistors T101 through T106 of the SRAM cell 100 are formed over various spaced apart active regions 102, 104, 106, and 108. Particularly, the active regions 102, 104, 106, and 108 are oriented lengthwise along a 1st direction and are arranged (spaced apart) in order from first to fourth along a second direction. The transistors T101 through T106 further includes gates (or gate stacks or gate terminals) G101, G102, G103, G104, G105, and G106, respectively. The active regions 102, 104, 106, and 108 may be in the form of planar active regions, where the respective gate is disposed over a flat surface of the respective active region. Alternatively, the active regions 102, 104, 106, and 108 may be in the form of active fins, where the respective gate is disposed over two or more surfaces of the respective active fin, making the transistors T101 through T106 FinFETs.

Also shown in FIG. 1B are a plurality of spaced apart conductive regions 150, 144, 140, 146, 142, 148, and 152. The conductive regions 150, 140, 142 and 152 have conductors of a first conductive layer type and the conductive regions 144, 146, and 148 have conductors of a second conductive layer type that is different from the first conductive layer type.

Still referring to FIG. 1B, the active region 102 comprises S/D regions of the transistors T101 and T102. The channel regions of transistors T101 and T102 are underneath the gates G101 and G102 respectively, and the S/D regions of transistors T101 and T102 are on opposite sides of the gates G101 and G102 respectively. In the present embodiment, transistors T101 and T102 share an S/D region that is between the gates G101 and G102. In an alternative embodiment, transistors T101 and T102 have separate S/D regions.

The active region 104 comprises a channel region and two S/D regions of the transistor T103. The channel region of transistor T103 is underneath the gate G103, and the S/D regions of transistor T103 are on opposite sides of the gate G103. The active region 106 comprises a channel region and two S/D regions of the transistor T104. The channel region of transistor T104 is underneath the gate G104, and the S/D regions of transistor T104 are on opposite sides of the gate G104.

The active region 108 comprises S/D regions of the transistors T105 and T106. The channel regions of transistors T105 and T106 are underneath the gates G105 and G106, respectively, and the S/D regions of transistors T105 and T106 are on opposite sides of the gates G105 and G106, respectively. In the present embodiment, transistors T105 and T106 share an S/D region that is between the gates G105 and G106. In an alternative embodiment, transistors T105 and T106 have separate S/D regions.

Each of the active regions 102, 104, 106, and 108 comprises one or more semiconductor materials such as silicon, germanium, silicon germanium, silicon carbide, gallium arsenide, indium arsenide, indium phosphide, GaAsP, AlInAs, AlGaAs, InGaAs, GaInP, and/or GaInAsP, or combinations thereof.

The channel regions of the transistors T101 through T106 may be doped or undoped (including unintentionally doped). The S/D regions of the transistors T101 through T106 are doped with appropriate materials for the conductivity type of the respective transistor. In an embodiment, the transistors T103 and T104 are PMOS FETs (p-type conductivity) and the other transistors, T101, T102, T105 and T106 are NMOS FETs (n-type conductivity). Therefore, the S/D regions of the transistors T103 and T104 are doped with a p-type material such as boron, and the S/D regions of the other transistors are doped with an n-type material such as phosphorus. The S/D regions of the transistors T101 through T106 may comprise epitaxially grown semiconductor material, such as epitaxially grown silicon for the NMOS FETs or epitaxially grown silicon germanium for the PMOS FETs.

The gates G101, G102, G103, G104, G105, and G106 are oriented lengthwise along the second direction. In the present embodiment, the gates G102, G103, and G106 are aligned on a straight line in a conductive region 140; and the gates G101, G104, and the G105 are aligned on another straight line in a conductive region 142. Each of the gates G101 through G106 includes a gate dielectric layer and a gate electrode layer over the gate dielectric layer. The gate electrode layer may comprise polysilicon (or poly), a type of metal, or some other type of conductor. In some embodiments, each of the gates G101 through G106 may further include an interfacial layer between the gate dielectric layer and the underlying channel semiconductor material. The gate electrode layer in the gates G101 through G106 may include one or more work function layers and a metal fill (or bulk metal) layer. The gates G102 and G103 are electrically connected, for example, by sharing a common metal layer in the respective gates in the embodiment shown or by upper level metal interconnects in an alternative embodiment. The gates G104 and G105 are electrically connected, for example, by sharing a common metal layer in the respective gates in the embodiment shown or by upper level metal interconnects in an alternative embodiment.

The SRAM cell 100 further includes various contacts (or S/D contacts) 122, 124, 126, 128, 130, 132, 134, and 136 disposed over the S/D regions of the transistors T101 through T106 and aligned on a straight line in the second direction in one of conductive regions 144, 146, or 148. The contacts 122, 124, 126, 128, 130, 132, 134, and 136 in conductive regions 144, 146, and 148 comprise a different conductor type than the conductors in gates G101, G102, G103, G104, G105, and G106 in conductive regions 140 and 142.

The contact 128 is disposed over the shared S/D region of transistors T101 and T102 in conductive region 146. The contacts 130 and 122 are disposed over the other S/D regions of transistors T101 and T102, respectively, in conductive regions 148 and 144, respectively. The contact 122 serves as one VSS terminal. The contact 130 serves as the BL terminal. The contact 128 is also disposed over an S/D region of the transistor T103 to electrically couple the S/D regions of transistors T101, T102, and T103. The contact 124 is disposed over another S/D region of transistors T103 in conductive region 144 and serves as one VDD terminal.

The contact 132 is disposed over the shared S/D region of transistors T105 and T106 in conductive region 146. The contacts 136 and 126 are disposed over the other S/D regions of transistors T105 and T106, respectively, in conductive regions 148 and 144, respectively. The contact 126 serves as the BLB terminal. The contact 136 serves as one VSS terminal. The contact 132 is also disposed over an S/D region of transistor T104 to electrically couple the S/D regions of transistors T104, T105, and T106. The contact 134 is disposed over another S/D region of transistor T104 in conductive region 148 and serves as one VDD terminal.

The example SRAM cell 100 is replicated many times in a SRAM design to form an SRAM array 50. In many SRAM designs, the polysilicon pitch (e.g., the distance between one edge of the gate material in a first transistor to the same edge of the gate material of the next transistor along the first direction) for arrays of SRAM cells is uni-pitch (has the same value), often to allow greater transistor density. This causes all of the devices (e.g., transistors) in the cell to have the same performance. This does not allow the performance of specific devices to be adjusted. Due to the miniaturization of SRAM cells, performance enhancement may be beneficial for some of the devices. With a 6T SRAM cell, reducing MOS source side resistance of the PD1, PD2, PG1, and PG2 transistors can result in improved device performance and ultimately improved SRAM cell performance.

The example SRAM cell 100 achieves improved device performance by varying the width of the contacts in conductive regions 144, 146, and 148, and consequently varying the PO pitch of the devices. Contacts 122, 130, 126, and 134 (each with dimension $D_{11}$=W+K, wherein W is a nominal width and K is a constant) have a larger dimension in the first direction than contacts 128 and 132 (each with dimension $D_{12}$=W−K). This results in both the poly pitch 160 ($P_{11}$=P−K, wherein P is a nominal poly pitch dimension) between devices having gates in the conductive regions 140 and 142 to be different (smaller) than the poly pitch 162 ($P_{12}$=P+K) between devices having gates in conductive regions 140 and 150, and the poly pitch 160 ($P_{11}$=P−K) between devices having gates in the conductive regions 140 and 142 to be different (smaller) than the poly pitch 164 ($P_{12}$=P+K) between devices having gates in conductive regions 142 and 152. Varying the PO pitch of the devices can result in reduced MOS source side resistance and consequently enhanced performance for transistors T101, T102, T105, and T106 can be achieved.

Figure 2A:
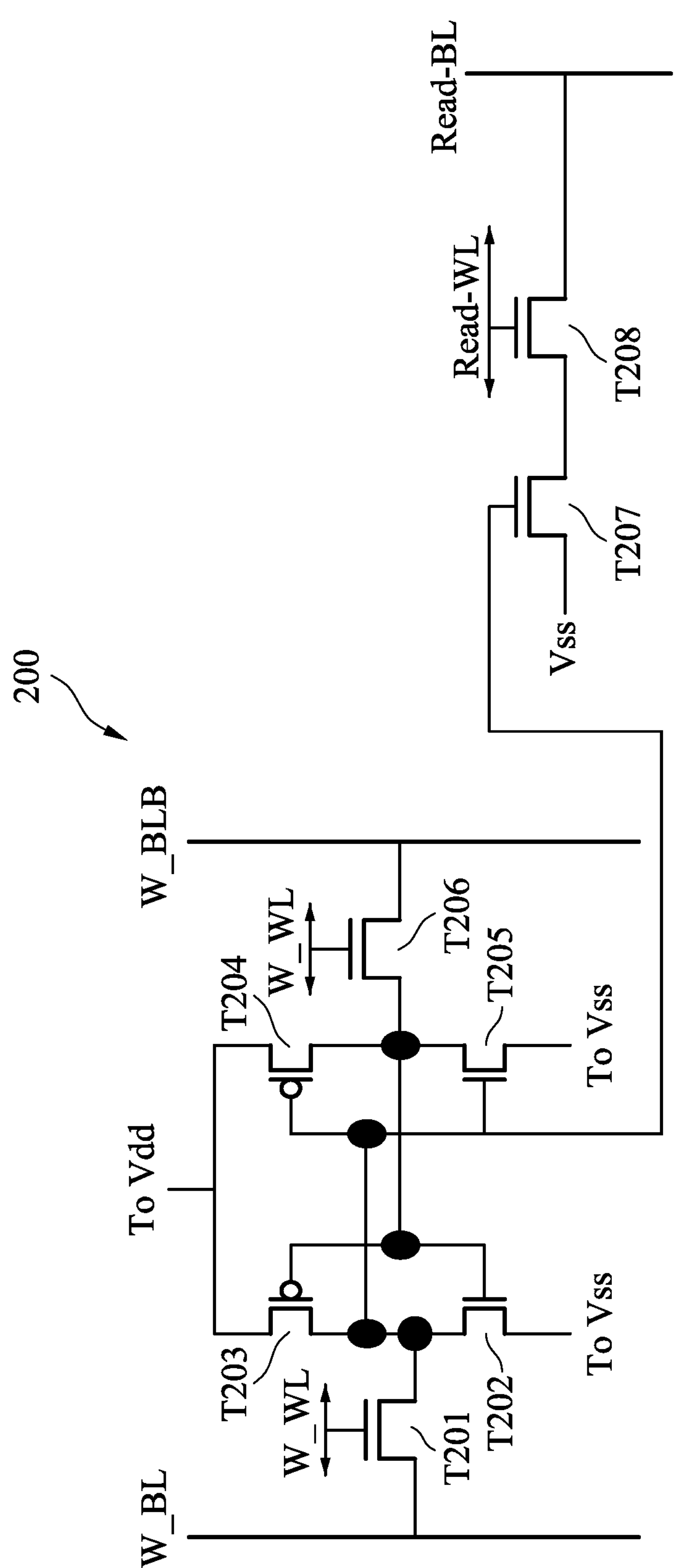
FIG. 2A shows a schematic logic diagram of an example 8T SRAM cell, in accordance with some embodiments.
Figure 2B:
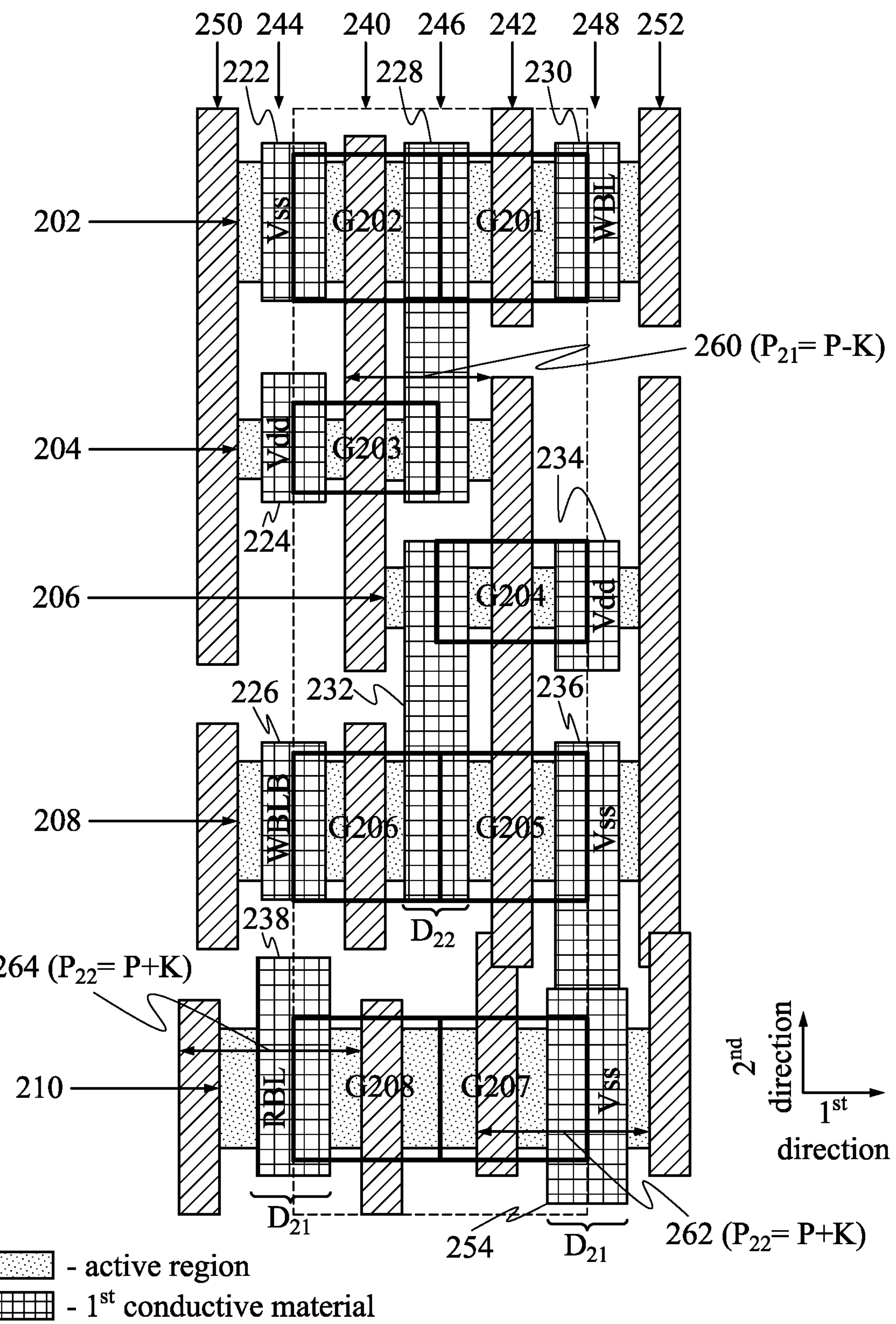
FIG. 2B shows a layout (of certain layers) and a top view of the 8T SRAM cell of FIG. 2A, in accordance with some embodiments.
Figure 2C:
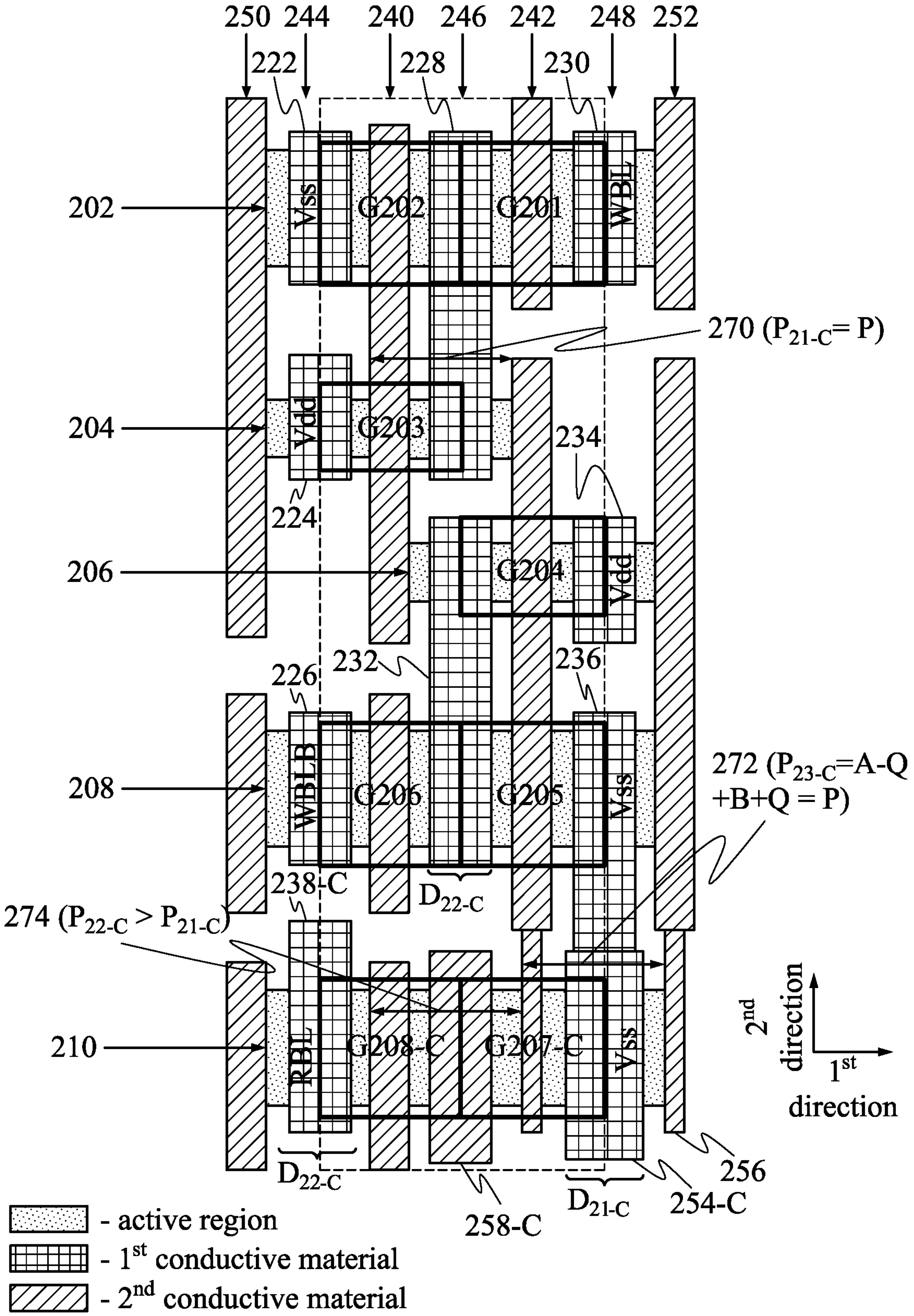
FIG. 2C shows a layout (of certain layers) and a top view of the 8T SRAM cell of FIG. 2A, in accordance with some embodiments.

FIG. 2A shows a schematic logic diagram of an example 8T SRAM cell 200. FIG. 2B shows a layout (of certain layers) and a top view of the SRAM cell 200 in an embodiment. FIG. 2C shows a layout (of certain layers) and a top view of the SRAM cell 200 in another embodiment. Referring to FIG. 2A, the 8T SRAM cell 200 includes a write port and a read port. The write port includes two inverters cross-coupled for storage. The first inverter includes a pull-up transistor PU1 (or T203) and a pull-down transistor PD1 (or T202) connected in series between high and low potentials, VDD and VSS. The second inverter includes a pull-up transistor PU2 (or T204) and a pull-down transistor PD2 (or T205) connected in series between the high and low potentials, VDD and VSS. The write port further includes two pass gate transistors PG1 (or T201) and PG2 (or T206). The gate terminals of PG1 and PG2 are connected to word line WL. One of the two source/drain (S/D) terminals of PG1 is coupled to the gate terminals of PU2 and PD2, and the other one of the two S/D terminals of PG1 is coupled to bit line BL. One of the two source/drain (S/D) terminals of PG2 is coupled to the gate terminals of PU1 and PD1, and the other one of the two S/D terminals of PG2 is coupled to inverse bit line (BLB). The read port includes two transistors T207 and T208. In the embodiment shown, the gate terminal of transistor T207 is coupled to the gate terminals of PU2 and PD2. One of two S/D terminals of transistor T207 is coupled to a low potential VSS and the other one is coupled to one of two S/D terminals of transistor T208. The other S/D terminal of transistor T208 is coupled to read bit line RBL. The gate terminal of transistor T208 is coupled to read word line RWL.

Referring to FIG. 2B, the transistors T201 through T208 of the SRAM cell 200 are formed over various spaced apart active regions 202, 204, 206, 208 and 210. Particularly, the active regions 202, 204, 206, 208 and 210 are oriented lengthwise along a 1st direction and are arranged (spaced apart) in order from first to fifth along a second direction. The transistors T201 through T208 further includes gates (or gate stacks or gate terminals) G201, G202, G203, G204, G205, G206, G207, and G208, respectively. The active regions 202, 204, 206, 208, and 210 may be in the form of planar active regions, where the respective gate is disposed over a flat surface of the respective active region. Alternatively, the active regions 202, 204, 206, 208, and 210 may be in the form of active fins, where the respective gate is disposed over two or more surfaces of the respective active fin, making the transistors T201 through T208 FinFETs.

Also shown in FIG. 2B are a plurality of spaced apart conductive regions 250, 244, 240, 246, 242, 248, and 252. The conductive regions 250, 240, 242 and 252 have conductors of a first conductive layer type and the conductive regions 244, 246, and 248 have conductors of a second conductive layer type that is different from the first conductive layer type.

Still referring to FIG. 2B, the active region 202 comprises S/D regions of the transistors T201 and T202. The channel regions of transistors T201 and T202 are underneath the gates G201 and G202 respectively, and the S/D regions of transistors T201 and T202 are on opposite sides of the gates G201 and G202 respectively. In the present embodiment, transistors T201 and T202 share an S/D region that is between the gates G201 and G202. In an alternative embodiment, transistors T201 and T202 have separate S/D regions.

The active region 204 comprises a channel region and two S/D regions of the transistor T203. The channel region of transistor T203 is underneath the gate G203, and the S/D regions of transistor T203 are on opposite sides of the gate G203. The active region 206 comprises a channel region and two S/D regions of the transistor T204. The channel region of transistor T204 is underneath the gate G204, and the S/D regions of transistor T204 are on opposite sides of the gate G204.

The active region 208 comprises S/D regions of the transistors T205 and T206. The channel regions of transistors T205 and T206 are underneath the gates G205 and G206, respectively, and the S/D regions of transistors T205 and T206 are on opposite sides of the gates G205 and G206, respectively. In the present embodiment, transistors T205 and T206 share an S/D region that is between the gates G205 and G206. In an alternative embodiment, transistors T205 and T206 have separate S/D regions.

The active region 210 comprises S/D regions of the transistors G207 and G208. The channel regions of transistors T207 and T208 are underneath the gates G207 and G208, respectively, and the S/D regions of G207 and G208 are on opposite sides of the gates G207 and G208, respectively. In the present embodiment, transistors T207 and T208 share an S/D region that is between the gates G207 and G208. In an alternative embodiment, transistors T207 and T208 have separate S/D regions.

Each of the active regions 202, 204, 206, 208, and 210 comprises one or more semiconductor materials such as silicon, germanium, silicon germanium, silicon carbide, gallium arsenide, indium arsenide, indium phosphide, GaAsP, AlInAs, AlGaAs, InGaAs, GaInP, and/or GaInAsP, or combinations thereof.

The channel regions of the transistors T201 through T208 may be doped or undoped (including unintentionally doped). The S/D regions of the transistors T201 through T208 are doped with appropriate materials for the conductivity type of the respective transistor. In an embodiment, the transistors T203 and T204 are PMOS FETs (p-type conductivity) and the other transistors, T201, T202, T205, T206, T207, and T208 are NMOS FETs (n-type conductivity). Therefore, the S/D regions of the transistors T203 and T204 are doped with a p-type material such as boron, and the S/D regions of the other transistors are doped with an n-type material such as phosphorus. The S/D regions of the transistors T201 through T208 may comprise epitaxially grown semiconductor material, such as epitaxially grown silicon for the NMOS FETs or epitaxially grown silicon germanium for the PMOS FETs.

The gates G201, G202, G203, G204, G205, G206, G207, and G208 are oriented lengthwise along the second direction. In the present embodiment, the gates G202, G203, and G206 are aligned on a straight line in a conductive region 240; gate G208 is offset from the straight line on which gates G202, G203, and G206 are aligned; gates G201, G204, and G205 are aligned on another straight line in a conductive region 242; and gate G207 is offset from the straight line on which gates G201, G204, and G205 are aligned. Each of the gates G201 through G208 includes a gate dielectric layer and a gate electrode layer over the gate dielectric layer. The gate electrode layer may comprise polysilicon (or poly), a type of metal, or some other type of conductor. In some embodiments, each of the gates G201 through G208 may further include an interfacial layer between the gate dielectric layer and the underlying channel semiconductor material. The gate electrode layer in the gates G201 through G208 may include one or more work function layers and a metal fill (or bulk metal) layer. The gates G202 and G203 are electrically connected, for example, by sharing a common metal layer in the respective gates in the embodiment shown or by upper level metal interconnects in an alternative embodiment. The gates G204, G205, and G207 are electrically connected, for example, by sharing a common metal layer in the respective gates in the embodiment shown or by upper level metal interconnects in an alternative embodiment.

The SRAM cell 200 further includes various contacts (or S/D contact) 222, 224, 226, 228, 230, 232, 234, 236, 238, and 254 disposed over the S/D regions of the transistors T201 through T208 and aligned on a straight line in the second direction in one of conductive regions 244, 246, or 248. The contacts 222, 224, 226, 228, 230, 232, 234, 236, 238, and 254 in conductive regions 244, 246, and 248 comprise a different conductor type than the conductors in gates G201, G202, G203, G204, G205, G206, G207, and G208 in conductive regions 240 and 242.

The contact 228 is disposed over the shared S/D region of transistors T201 and T202 in conductive region 246. The contacts 230 and 222 are disposed over the other S/D regions of transistors T201 and T202, respectively, in conductive regions 248 and 244, respectively. The contact 222 serves as one VSS terminal. The contact 230 serves as the BL terminal. The contact 228 is also disposed over an S/D region of the transistor T203 to electrically couple the S/D regions of transistors T201, T202, and T203. The contact 224 is disposed over another S/D region of transistor T203 in conductive region 244 and serves as one VDD terminal.

The contact 232 is disposed over the shared S/D region of transistors T205 and T206 in conductive region 246. The contacts 236 and 226 are disposed over the other S/D regions of transistors T205 and T206, respectively, in conductive regions 248 and 244, respectively. The contact 226 serves as the WBLB terminal. The contact 234 serves as one VSS terminal. The contact 232 is also disposed over an S/D region of transistor T204 to electrically couple the S/D regions of transistors T204, T205, and T206. The contact 234 is disposed over another S/D region of transistor T204 in conductive region 248 and serves as one VDD terminal.

No contact is disposed over the shared S/D region of transistors T207 and T208 in conductive region 246. The contacts 254 and 238 are disposed over the other S/D regions of transistors T207 and T208, respectively, in conductive regions 248 and 244, respectively. The contact 238 serves as the RBL terminal. The contact 254 serves as one VSS terminal.

The example SRAM cell 200 is replicated many times in a SRAM design to form an SRAM array. In many SRAM designs, the polysilicon pitch (e.g., the distance between one edge of the gate material in a first transistor to the same edge of the gate material of the next transistor along the first direction) for arrays of SRAM cells is uni-pitch (has the same value), often to allow greater transistor density. This causes all of the devices (e.g., transistors) in the cell to have the same performance. This does not allow the performance of specific devices to be adjusted. Due to the miniaturization of SRAM cells, performance enhancement may be beneficial for some of the devices. With an 8T SRAM cell, reducing MOS source side resistance of transistors T207 and T208 can result in improved device performance and ultimately improved SRAM cell performance.

The example SRAM cell 200 achieves improved device performance by varying the width of the contacts in conductive regions 244, 246, and 248, and consequently varying the PO pitch of the devices. Contacts 238 and 254 (each with dimension $D_{21}$=W+K, wherein W is a nominal width and K is a constant) have a larger dimension in the first direction than contacts 222, 224, 226, 228, 230, 232, 234, and 236 (each with dimension $D_{22}$=W−K). This results in the poly pitch 260 ($P_{21}$=P−K, wherein P is a nominal poly pitch) between transistors T203 and T204 to be different (smaller) than both the poly pitch 262 ($P_{22}$=P+K) between transistor T207 and a device outside of SRAM cell 200 (e.g., having a gate in conductive region 252) and the poly pitch 264 ($P_{22}$=P+K) between transistor T208 and a transistor outside of SRAM cell 200 (e.g., having a gate in conductive region 250). As a result, reduced MOS source side resistance and enhanced performance for transistors T207 and T208 can be achieved.

Referring to FIG. 2C, the example layout for transistors T201 through T206 in FIG. 2C is the same as the layout for transistors T201 through T206 of FIG. 2B. The example layout in FIG. 2C differs from the example layout in FIG. 2B with regard to the read port and the addition of conductor 258-C. For example, (1) the gate width of gate G207-C in the first direction for transistor T207 is narrower than the gate width in the first direction for all of the other transistors in the SRAM cell 200; (2) contact 238-C has the same dimension in the first direction as contacts 222, 224, 226, 228, 230, 232, 234, and 236 (each with dimension D2-C); (3) Gates G207-C and G208-C are aligned in the same line as the other gates in conductive regions 242 and 240, respectively; (4) the gates in conductive region 252 are aligned along the same line; and (5) the poly 256 in conductive region 252 is narrower than the other poly in conductive region 252.

Using the example layout shown in FIG. 2C, the example SRAM cell 200 achieves improved device performance by varying the width of the contacts in conductive regions 242, 248, and 252. Contact 254-C (with dimension $D_{21\text{-}C}$=W+Q, wherein W is a nominal width and Q is a constant) has a larger dimension in the first direction than contacts 222, 224, 226, 228, 230, 232, 234, 236, and 238-C (each with dimension $D_{22\text{-}C}$=W). To achieve a larger PO space for a wider contact 254-C, the PO can be made narrow without changing PO pitch 272 ($P_{23\_C}$). For example, PO width=A−Q, PO space=B+Q, and PO pitch=A−Q+B+Q=P. Because the gate G207-C in conductive region 242 has a smaller dimension in the first direction than the other gates in the SRAM cell 200, the poly pitch 270 ($P_{21\_C}$=P) for transistors T201 to T206 is different (smaller) than the poly pitch 274 ($P_{22\_C}$) between transistor T207 and transistor T208. As a result, reduced MOS source side resistance and enhanced performance for transistor T207 can be achieved.

Figure 3A:
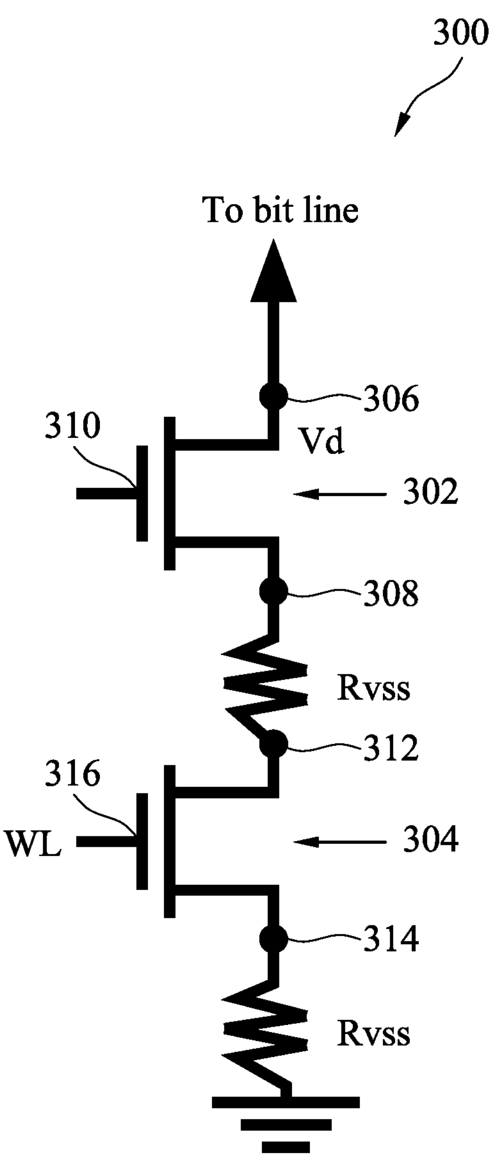
FIG. 3A shows a schematic logic diagram of an example memory cell for use in a memory array, in accordance with some embodiments.
Figure 3B:
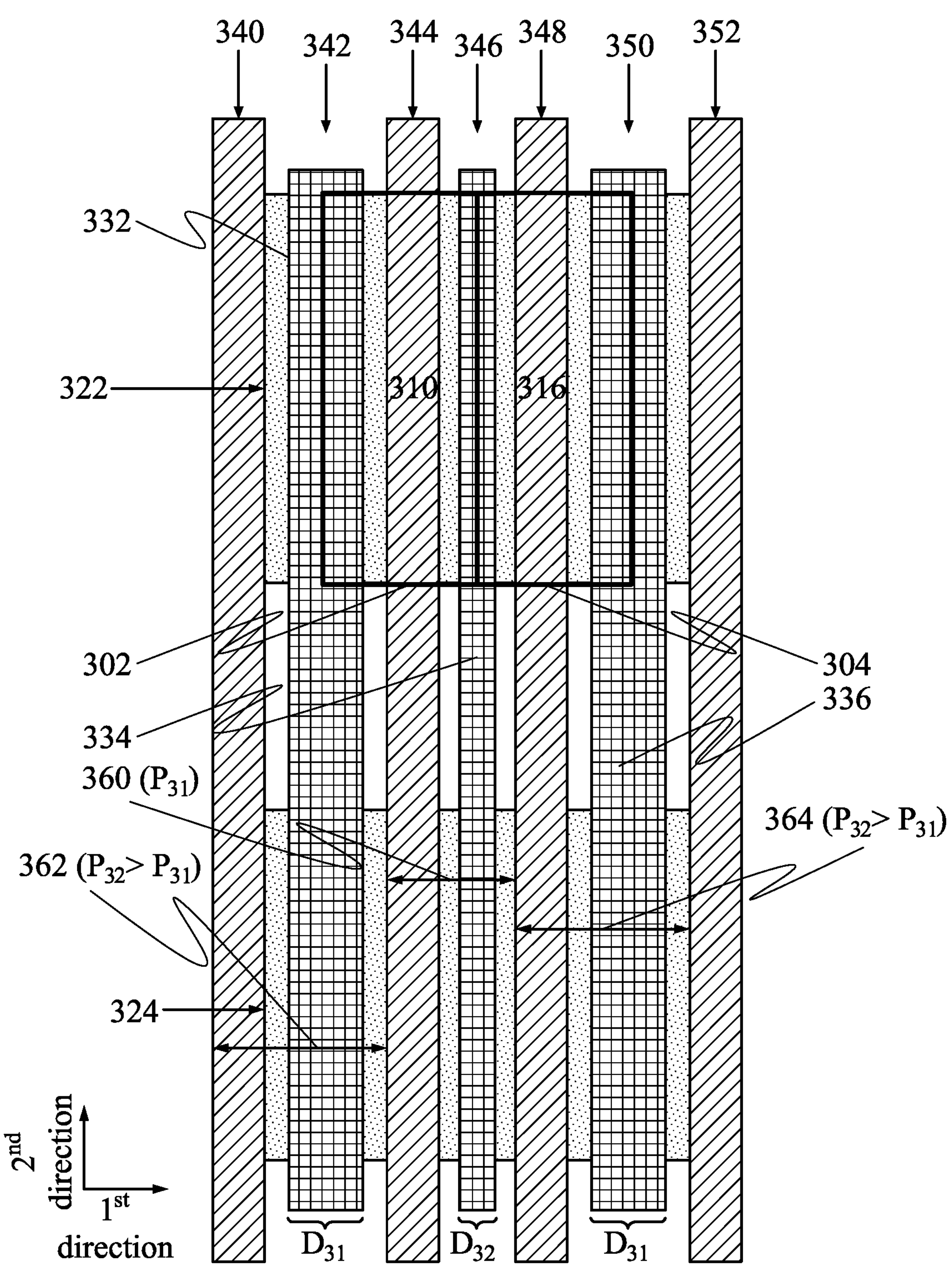
FIG. 3B shows a layout (of certain layers) and a top view of the memory cell of FIG. 3A, in accordance with some embodiments.

FIG. 3A shows a schematic logic diagram of an example memory cell 300 for use in a memory array. FIG. 3B shows a layout (of certain layers) and a top view of the memory cell 300 in an embodiment. Referring to FIG. 3A, the memory cell 300 includes a fuse in the form of a first transistor 302 connected in series with a second transistor 304, both of which are shown in circuit representation. The first transistor or fuse 302 includes a drain 306, a source 308 and a gate 310. The second transistor 304 also includes a drain 312, a source 314 and a gate 316. Drain 306 is connected to a bit line (BL). Source 308 is connected to drain 312. Gate 316 is connected to a word line (W)L and source 314 is grounded. The second transistor 304 is also referred to as a selector or a selector transistor. When selector transistor 304 is off, it electrically isolates cell 300 from other components (e.g., of a memory array), but when it is on, it enables an electrical path though fuse 302 (e.g., to ground).

Applying an appropriate voltage level to the word line (WL) and bit line (BL) allows accessing the status or logic level of cell 300. For example, to read cell 300, word line (WL) is selected, which turns on transistor 304, then bit line (BL) is sensed (e.g., by a sense amplifier) to detect the impedance of fuse 302. If this impedance is high, then cell 300 is high. Conversely, if this impedance is low, then cell 300 is low. To program cell 300, the word line (WL) is selected to turn on transistor 304. Fuse 302 is then programmed. As fuse 302 is programmed, cell 300 is programmed.

Referring to FIG. 3B, the transistors 302 and 304 of the memory cell 300 are formed over an active region 322 and another set of transistors 302 and 304 are formed over an active region 324 that is spaced apart from active region 322. Particularly, the active regions 322 and 324 are oriented lengthwise along a 1st direction and are arranged (spaced apart) in order from first to second along a second direction. The active regions 322 and 324 may be in the form of planar active regions, where the respective gate is disposed over a flat surface of the respective active region. Alternatively, the active regions 322, and 324 may be in the form of active fins, where the respective gate is disposed over two or more surfaces of the respective active fin, making the transistors 302 through 304 FinFETs.

Also shown in FIG. 3B are a plurality of spaced apart conductive regions 340, 342, 344, 346, 348, 350, and 352. The conductive regions 340, 344, 348, and 352 have conductors a first conductive layer type and the conductive regions, 342, 346, and 350 have conductors of a second conductive layer type that is different from the first conductive layer type.

Still referring to FIG. 3B, the active region 322 comprises S/D regions of the transistors 302 and 304. The channel regions of transistors 302 and 304 are underneath the gates 310 and 316 respectively, and the S/D regions of 302 and 304 are on opposite sides of the gates 310 and 316 respectively. In the present embodiment, transistors 302 and 304 share an S/D region that is between the gates 310 and 316. In an alternative embodiment, transistors 302 and 304 may have separate S/D regions.

Each of the active regions 322 and 324 comprises one or more semiconductor materials such as silicon, germanium, silicon germanium, silicon carbide, gallium arsenide, indium arsenide, indium phosphide, GaAsP, AlInAs, AlGaAs, InGaAs, GaInP, and/or GaInAsP, or combinations thereof.

The channel regions of the transistors 302 and 304 may be doped or undoped (including unintentionally doped). The S/D regions of the transistors 302 and 304 are doped with appropriate materials for the conductivity type of the respective transistor. In an embodiment, the transistors 302 and 304 are NMOS FETs (n-type conductivity). Therefore, the S/D regions of the transistors 302 and 304 are doped with a n-type such as phosphorus. The S/D regions of the transistors 302 and 304 may comprise epitaxially grown semiconductor material, such as epitaxially grown silicon for the NMOS FETs.

The gates 310 and 316 are oriented lengthwise along the second direction in conductive regions 344 and 346 respectively. Each of the gates 310 and 316 includes a gate dielectric layer and a gate electrode layer over the gate dielectric layer. The gate electrode layer may comprise polysilicon (or poly), a type of metal, or some other type of conductor. In some embodiments, each of the gates 310 and 316 may further include an interfacial layer between the gate dielectric layer and the underlying channel semiconductor material. The gate electrode layer in the gates 310 and 316 may include one or more work function layers and a metal fill (or bulk metal) layer.

The memory cell 300 further includes various contacts (or S/D contacts) 332, 334, and 336 disposed over the S/D regions of the transistors 302 and 304 and aligned in the second direction in one of conductive regions 342, 346, or 350.

The contact 334 is disposed over the shared S/D region of transistors 302 and 304 in conductive region 346. The contacts 332 and 336 are disposed over the other S/D regions of transistors 302 and 304, respectively, in conductive regions 342 and 350, respectively. The contact 332 serves as one VD terminal. The contact 336 serves one Vss terminal.

The example memory cell 300 is replicated many times in a memory design to form a memory array. In many memory designs, the polysilicon pitch (e.g., the distance between one edge of the gate material in a first transistor to the same edge of the gate material of the next transistor along the first direction) for arrays of memory cells is uni-pitch (has the same value), often to allow greater transistor density. This causes all of the devices (e.g., transistors) in the cell to have the same performance. This does not allow the performance of specific devices to be adjusted. Due to the miniaturization of memory cells, performance enhancement may be beneficial for some of the devices. With memory cell 300, reducing MOS source side resistance of transistors 302 and 304 can result in improved device performance and ultimately improved memory cell performance.

The example memory cell 300 achieves improved device performance by varying the width of the contacts in conductive regions 342, 346, and 350, and consequently varying the PO pitch of the devices. Contacts 332 and 336 (each with dimension $D_{31}$) have a larger dimension in the first direction than contact 334 (with dimension $D_{32}$). This results in the poly pitch 360 ($P_{31}$) between transistors 302 and 304 to be different (smaller) than the poly pitch 362 ($P_{32}$) between the poly in transistor 302 and the poly in conductive region 340 This also results in the poly pitch 360 ($P_{31}$) between transistors 302 and 304 to be different (smaller) than the poly pitch 364 ($P_{32}$) between the poly in transistor 304 and the poly in conductive region 352. As a result, reduced MOS source side resistance and enhanced performance for transistors 302 and 304 can be achieved.

By selectively varying the dimensions of conductive material over the S/D regions, and consequently varying PO pitch, improved device performance can be achieved where needed.

Figure 4:
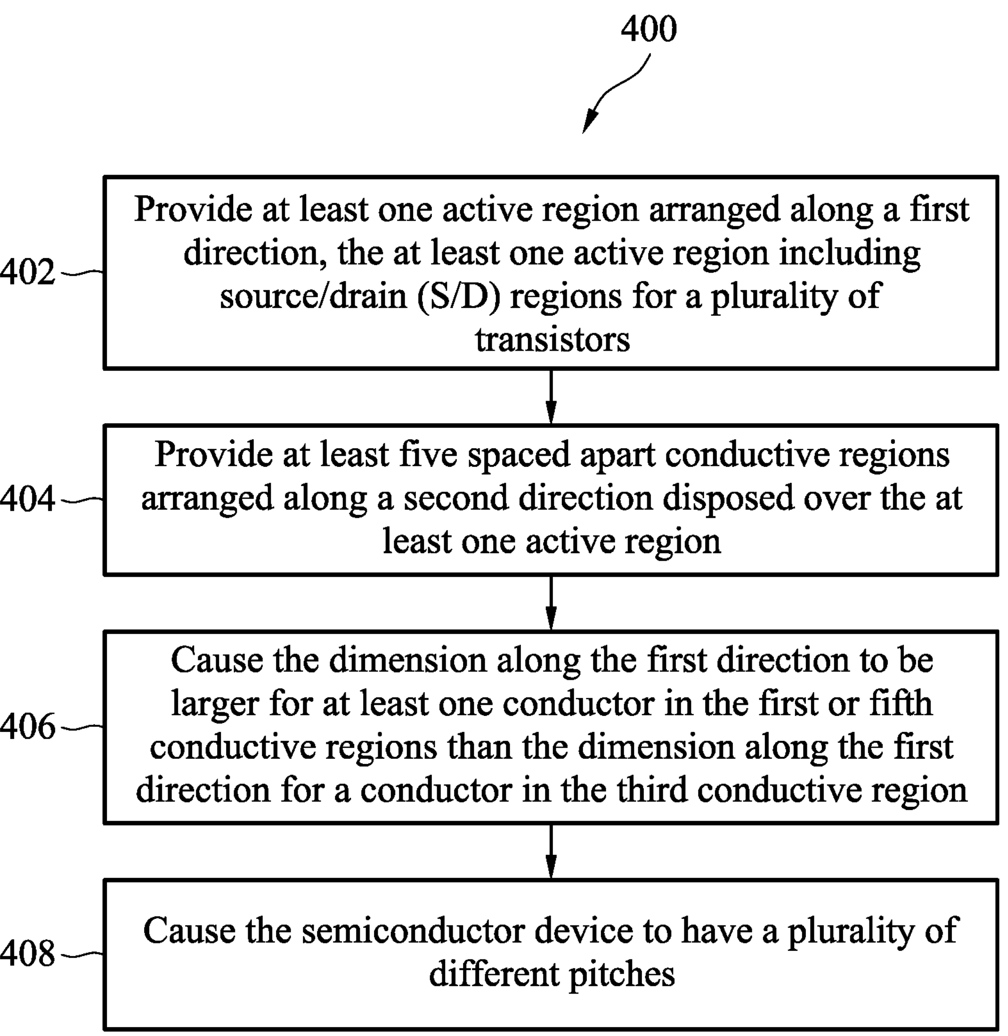
FIG. 4 is a process flow chart depicting an example process of forming a semiconductor device having a plurality of cells arranged in an array, in accordance with some embodiments.

FIG. 4 is a process flow chart depicting an example process 400 of forming a semiconductor device having a plurality of cells arranged in an array. In some embodiments, the plurality of cells comprise a plurality of memory cells. In some embodiments, the plurality of cells comprise a plurality of SRAM cells. The example process 400 includes providing at least one active region arranged along a first direction, the at least one active region including source/drain (S/D) regions for a plurality of transistors (operation 402).

The example process 400 includes providing at least five spaced apart conductive regions arranged along a second direction disposed over the active regions (operation 404). The second conductive region is disposed between the first and third conductive regions and the fourth conductive region is disposed between the third and fifth conductive regions. The first, second, third, fourth, and fifth conductive regions comprise one or more conductors, wherein the one or more conductors in the first, second, third, fourth, and fifth conductive regions have a dimension along the first direction. In one embodiment, the example process 400 further includes depositing a first conductive layer type in the first, third and fifth conductive regions and a second conductive layer type in the second and fourth conductive regions. In one embodiment, the first conductor type comprises a metal one conductor and the second conductor type comprises a polysilicon based conductor.

The example process 400 includes causing the dimension along the first direction to be larger for at least one conductor in the first or fifth conductive regions than the dimension along the first direction for a conductor in the third conductive region (operation 406). In some embodiments, the example process 400 optionally includes causing the dimension along the first direction to be smaller for at least one conductor in the second or fourth conductive regions than the dimension along the first direction of another conductor in the second or fourth conductive regions.

The example process 400 includes causing the semiconductor device to have a plurality of different pitches (operation 408). A pitch between conductors is a distance along the first direction between one edge of a conductor in one conductive region to an equivalent edge of a conductor in a different conductive region. The pitch between a conductor in the second conductive region and a conductor in the fourth conductive region is less than the pitch between the conductor in the second conductive region and a conductor in a closest conductive region on an opposite side of a conductor in the first conductive region; or the pitch between a conductor in the second conductive region and a conductor in the fourth conductive region is less than the pitch between the conductor in the fourth conductive region and a conductor in a closest conductive region on an opposite side of a conductor in the fifth conductive region.

Although the foregoing examples are directed to memory cells, the foregoing techniques are applicable to other circuits, wherein the poly pitch in a particular type of circuit is varied to selectively improve the performance of certain devices. By selectively varying the dimensions of conductive material over the S/D regions, and consequently varying PO pitch, improved device performance can be achieved where needed.

A semiconductor device including a plurality of cells arranged in an array is provided in accordance with some embodiments. Each cell includes: at least one active region arranged along a first direction, the at least one active region including source/drain (S/D) regions for a plurality of transistors; and at least five spaced apart conductive regions arranged along a second direction disposed over the at least one active region, the at least five spaced apart conductive regions including a first conductive layer type in a first, third and fifth conductive region and a second conductive layer type in a second and fourth conductive region wherein the second conductive region is disposed between the first and third conductive regions and the fourth conductive region is disposed between the third and fifth conductive regions. The first and fifth conductive regions include one or more conductors for providing external electrical connections to transistors in the cell, the one or more conductors in the first and fifth conductive regions having a dimension along the first direction. The third conductive region includes one or more conductors for providing internal cell electrical connections, the one or more conductors in the third conductive region having a dimension along the first direction. The dimension along the first direction is larger for at least one conductor of the first conductive layer type in the first or fifth conductive regions than the dimension along the first direction for the one or more conductors of the first conductive layer type in the third conductive region. The semiconductor device has a plurality of different pitches between conductors of the second conductive layer type wherein a pitch between conductors is a distance along the first direction between one edge of a conductor in one conductive region to an equivalent edge of a conductor in a different conductive region.

In certain embodiments of the semiconductor device, the pitch between a conductor in the second conductive region and a conductor in the fourth conductive region is less than the pitch between the conductor in the second conductive region and a conductor in a closest conductive region on an opposite side of a conductor in the first conductive region; and/or the pitch between a conductor in the second conductive region and a conductor in the fourth conductive region is less than the pitch between the conductor in the fourth conductive region and a conductor in a closest conductive region on an opposite side of a conductor in the fifth conductive region.

In certain embodiments of the semiconductor device, the dimension along the first direction is larger for each conductor of the first conductive layer type in the first and fifth conductive regions than the dimension along the first direction for the one or more conductors of the first conductive layer type in the third conductive region.

In certain embodiments of the semiconductor device, the first conductor type includes a metal one conductor and the second conductor type includes a polysilicon based conductor.

In certain embodiments of the semiconductor device, the plurality of cells include a plurality of memory cells.

In certain embodiments of the semiconductor device, the dimension along the first direction is smaller for at least one conductor of the second conductive layer type in the second or fourth conductive regions than the dimension along the first direction of another conductor of the second conductive layer type in the second or fourth conductive regions.

A semiconductor device including a plurality of cells arranged in an array is provided in accordance with some embodiments. Each cell includes: at least one active region arranged along a first direction, the at least one active region including source/drain (S/D) regions for a plurality of transistors; at least five spaced apart conductive regions arranged along a second direction disposed over the active regions, the at least five spaced apart conductive regions including a first, second, third, fourth, and fifth conductive region, wherein the second conductive region is disposed between the first and third conductive regions and the fourth conductive region is disposed between the third and fifth conductive regions. The first, second, third, fourth, and fifth conductive regions include one or more conductors. The one or more conductors in the first, second, third, fourth, and fifth conductive regions have a dimension along the first direction. The dimension along the first direction is larger for at least one conductor in the first or fifth conductive regions than the dimension along the first direction for a conductor in the third conductive region. The cell has a plurality of different pitches wherein a pitch between conductors is a distance along the first direction between one edge of a conductor in one conductive region to an equivalent edge of a conductor in a different conductive region.

In certain embodiments, the pitch between a first conductor in the second conductive region and a first conductor in the fourth conductive region is less than the pitch between a second conductor in the second conductive region and a second conductor in the fourth conductive region.

In certain embodiments, the pitch between the first conductor in the second conductive region and the first conductor in the fourth conductive region is equal to the pitch between the second conductor in the fourth conductive region and a conductor in a closest conductive region on an opposite side of a conductor in the first conductive region; or the pitch between the first conductor in the second conductive region and the first conductor in the fourth conductive region is equal to the pitch between the second conductor in the fourth conductive region and a conductor in a closest conductive region on an opposite side of a conductor in the fifth conductive region.

In certain embodiments, the pitch between the first conductor in the second conductive region and the first conductor in the fourth conductive region is equal to the pitch between the second conductor in the fourth conductive region and a conductor in a closest conductive region on an opposite side of a conductor in the fifth conductive region; or the pitch between the first conductor in the second conductive region and the first conductor in the fourth conductive region is equal to the pitch between the second conductor in the second conductive region and a conductor in a closest conductive region on an opposite side of a conductor in the first conductive region.

In certain embodiments, the pitch between a conductor in the second conductive region and a conductor in the fourth conductive region is less than the pitch between a conductor in the fourth conductive region and a conductor in a closest conductive region on an opposite side of a conductor in the fifth conductive region; or the pitch between a conductor in the second conductive region and a conductor in the fourth conductive region is less than the pitch between a conductor in the second conductive region and a conductor in a closest conductive region on an opposite side of a conductor in the first conductive region.

In certain embodiments, the dimension along the first direction is larger for a conductor in the first or fifth conductive regions than the dimension along the first direction for a conductor in the third conductive region.

In certain embodiments, the dimension along the first direction is larger for each conductor in the first and fifth conductive regions than the dimension along the first direction for the one or more conductors in the third conductive region.

In certain embodiments, the dimension along the first direction is smaller for at least one conductor in the second or fourth conductive regions than the dimension along the first direction of another conductor in the second or fourth conductive regions.

A method of forming a semiconductor device having a plurality of cells arranged in an array is provided in accordance with some embodiments. The method includes: providing at least one active region arranged along a first direction, the at least one active region including source/drain (S/D) regions for a plurality of transistors; providing at least five spaced apart conductive regions arranged along a second direction disposed over the active regions, the at least five spaced apart conductive regions including a first, second, third, fourth, and fifth conductive region, wherein the second conductive region is disposed between the first and third conductive regions and the fourth conductive region is disposed between the third and fifth conductive regions, wherein the first, second, third, fourth, and fifth conductive regions include one or more conductors, wherein the one or more conductors in the first, second, third, fourth, and fifth conductive regions have a dimension along the first direction; causing the dimension along the first direction to be larger for at least one conductor in the first or fifth conductive regions than the dimension along the first direction for a conductor in the third conductive region; and causing the semiconductor device to have a plurality of different pitches wherein a pitch between conductors is a distance along the first direction between one edge of a conductor in one conductive region to an equivalent edge of a conductor in a different conductive region.

In certain embodiments of the method, the method further includes causing the dimension along the first direction to be smaller for at least one conductor in the second or fourth conductive regions than the dimension along the first direction of another conductor in the second or fourth conductive regions.

In certain embodiments of the method, the method further includes depositing a first conductive layer type in the first, third and fifth conductive regions and a second conductive layer type in the second and fourth conductive regions.

In certain embodiments of the method, the first conductor type includes a metal one conductor and the second conductor type includes a polysilicon based conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a plurality of cells arranged in an array, wherein each cell of the plurality of cells comprises a first plurality of transistors;

a first cell of the plurality of cells comprising at least four active regions that extend lengthwise along a first direction and are spaced apart along a second direction, each of the at least four active regions comprising a source region and a drain region for at least one transistor of the first plurality of transistors; and seven conductive layers that extend lengthwise along the second direction across a first active region of the at least four active regions and are spaced apart along the first direction, the seven conductive layers comprising in sequence a first gate conductor, a first source/drain (S/D) conductor, a second gate conductor, a second S/D conductor, a third gate conductor, a third S/D conductor, and a fourth gate conductor;

wherein a first gate-to-gate pitch between the second gate conductor and the third gate conductor is different from a second gate-to-gate pitch between the second gate conductor and the first gate conductor.

2. The semiconductor device of claim 1, wherein the second gate-to-gate pitch is larger in magnitude than the first gate-to-gate pitch.

3. The semiconductor device of claim 1, wherein the first gate conductor extends over a second active region of the at least four active regions.

4. The semiconductor device of claim 1, wherein:

the first S/D conductor has a first dimension along the first direction; and the second S/D conductor has a second dimension along the first direction that is different from the first dimension.

5. The semiconductor device of claim 4, wherein the second dimension is greater in magnitude than the first dimension.

6. The semiconductor device of claim 4, wherein a third gate-to-gate pitch between the third gate conductor and the fourth gate conductor is different from the first gate-to-gate pitch.

7. The semiconductor device of claim 4, wherein the second S/D conductor extends lengthwise along the second direction across a second active region of the at least four active regions.

8. The semiconductor device of claim 1, wherein the plurality of cells arranged in the array comprises a plurality of memory cells arranged in a memory array.

9. A semiconductor device comprising:

a plurality of cells arranged in an array, wherein each cell of the plurality of cells comprises a first plurality of transistors;

a first cell of the plurality of cells comprising at least four active regions that extend lengthwise along a first direction and are spaced apart along a second direction, each of the at least four active regions comprising a source region and a drain region for at least one transistor of the first plurality of transistors;

seven conductive layers that extend lengthwise along the second direction across a first active region of the at least four active regions and are spaced apart along the first direction, the seven conductive layers comprising in sequence a first gate conductor, a first source/drain (S/D) conductor, a second gate conductor, a second S/D conductor, a third gate conductor, a third S/D conductor, and a fourth gate conductor; and wherein the first S/D conductor has a first dimension along the first direction;

wherein the second S/D conductor has a second dimension along the first direction that is different from the first dimension.

10. The semiconductor device of claim 9, wherein a first gate-to-gate pitch between the second gate conductor and the third gate conductor is different from a second gate-to-gate pitch between the third gate conductor and the fourth gate conductor.

11. The semiconductor device of claim 10, wherein the first gate-to-gate pitch is lower in magnitude than the second gate-to-gate pitch.

12. The semiconductor device of claim 9, wherein the first gate conductor extends lengthwise along the second direction across a second active region of the at least four active regions.

13. The semiconductor device of claim 9, wherein the second dimension is greater in magnitude than the first dimension.

14. The semiconductor device of claim 9, wherein the second gate conductor extends lengthwise along the second direction across a second active region of the at least four active regions.

15. The semiconductor device of claim 9, wherein the second S/D conductor extends lengthwise along the second direction across a second active region of the at least four active regions.

16. The semiconductor device of claim 9, wherein the plurality of cells arranged in the array comprises a plurality of memory cells arranged in a memory array.

17. A semiconductor device comprising:

a plurality of memory cells arranged in a memory array, wherein each memory cell of the plurality of memory cells comprises a first plurality of transistors;

a first memory cell of the plurality of memory cells comprising at least four active regions that extend lengthwise along a first direction and are spaced apart along a second direction, each of the at least four active regions comprising a source region and a drain region for at least one transistor of the first plurality of transistors;

seven conductive layers that extend lengthwise along the second direction across a first active region of the at least four active regions and are spaced apart along the first direction, the seven conductive layers comprising in sequence a first gate conductor, a first source/drain (S/D) conductor, a second gate conductor, a second S/D conductor, a third gate conductor, a third S/D conductor, and a fourth gate conductor;

wherein the first gate conductor extends lengthwise along the second direction across a second active region of the at least four active regions;

wherein the second gate conductor extends lengthwise along the second direction across the second active region of the at least four active regions;

wherein the second S/D conductor extends lengthwise along the second direction across the second active region of the at least four active regions;

wherein the first S/D conductor has a first dimension along the first direction;

wherein the second S/D conductor has a second dimension along the first direction; and wherein the first dimension is different from the second dimension.

18. The semiconductor device of claim 17, wherein a first gate-to-gate pitch between the second gate conductor and the third gate conductor is different from a second gate-to-gate pitch between the second gate conductor and the first gate conductor.

19. The semiconductor device of claim 18, wherein the first gate-to-gate pitch is lower in magnitude than the second gate-to-gate pitch.

20. The semiconductor device of claim 17, wherein the second dimension is greater in magnitude than the first dimension.

* * * * *